United States Patent
Fujiwara et al.

(10) Patent No.: US 7,141,497 B2
(45) Date of Patent: Nov. 28, 2006

(54) MOCVD APPARATUS AND METHOD

(75) Inventors: Akihiro Fujiwara, Kitakyushu (JP); Shoji Hiramatsu, Onga-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/859,190

(22) Filed: Jun. 3, 2004

(65) Prior Publication Data

US 2005/0014366 A1    Jan. 20, 2005

(30) Foreign Application Priority Data

Jun. 6, 2003    (JP) .............................. 2003-162133

(51) Int. Cl.
*H01L 21/44* (2006.01)
(52) U.S. Cl. ................ 438/681; 438/680; 257/E21.575
(58) Field of Classification Search ................ 438/168, 438/680, 681; 257/E21.575, E21.586; 118/694, 118/711, 684
See application file for complete search history.

(56) References Cited

U.S. PATENT DOCUMENTS 5,966,499 A * 10/1999 Hinkle et al. ............... 392/388
6,314,992 B1 * 11/2001 Ohmi et al. ................. 137/486
6,581,623 B1 * 6/2003 Carpenter et al. ........... 137/113
2004/0247787 A1 * 12/2004 Mackie et al. ............ 427/248.1

FOREIGN PATENT DOCUMENTS

GB     2333614 A    *   7/1999
JP     2002-246323        8/2002

* cited by examiner

*Primary Examiner*—Caridad Everhart
(74) *Attorney, Agent, or Firm*—Oblon, Spivak, McClelland, Maier & Neustadt, P.C.

(57) ABSTRACT

An MOCVD apparatus includes a raw material supply section configured to supply a process raw material into a process chamber. The raw material supply section includes a bubbling unit that stores an organic metal raw material in a liquid state. A carrier gas line is configured to supply, into the bubbling unit, a carrier gas that causes the organic metal raw material in a liquid state to bubble up. A flow rate control portion is provided on the carrier gas line to control the carrier gas flow rate. The flow rate control portion includes a plurality of mass flow controllers, which are disposed in parallel with each other and have full-scales different from each other for flow rate control. The mass flow controllers are switched for use, in accordance with the carrier gas flow rate.

10 Claims, 3 Drawing Sheets

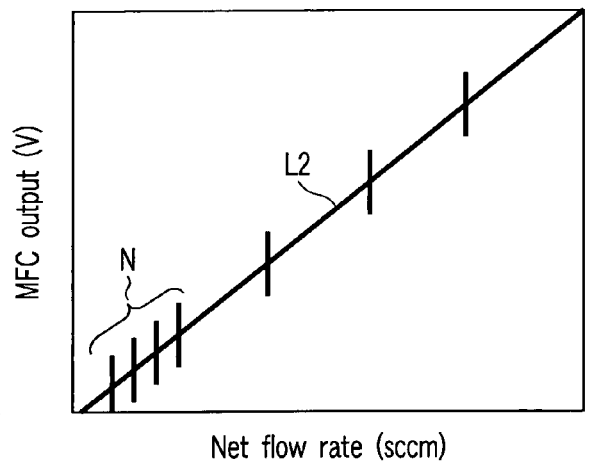
FIG. 3
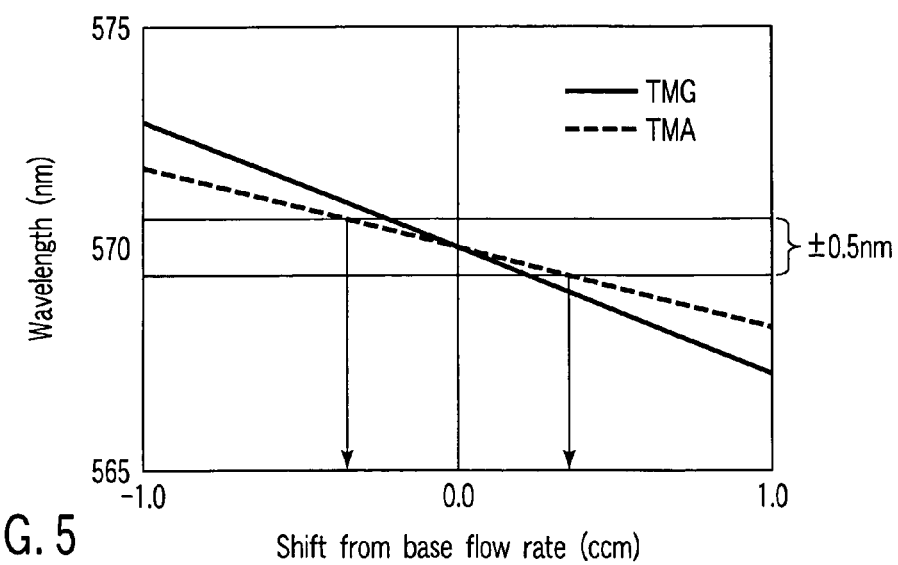
FIG. 4
FIG. 5

MOCVD APPARATUS AND METHOD

CROSS-REFERENCE TO RELATED APPLICATIONS

This application is based upon and claims the benefit of priority from prior Japanese Patent Application No. 2003-162133, filed Jun. 6, 2003, the entire contents of which are incorporated herein by reference.

BACKGROUND OF THE INVENTION

1. Field of the Invention

The present invention relates to an MOCVD apparatus and method for forming an epitaxial film on a target substrate by means of MOCVD (Metal Organic Chemical Vapor Deposition).

2. Description of the Related Art

In manufacturing opto-electronics devices, such as a light-emitting diode (LED), laser diode, and photo diode, MOCVD is utilized. For example, in the process of manufacturing LEDs, a group III–V nitride film expressed by a general formula $Al_xGa_yIn_zN$ (where x+y+z=1, x≧0, y≧0, z≧0) is epitaxially grown on a sapphire substrate by means of MOCVD.

MOCVD is suitable for film-formation of a compound semiconductor film, as compared with LPE (Liquid Phase Epitaxy) and VPE (Vapor Phase Epitaxy). For example, in the case of LPE, a large degree of Al segregation coefficient makes it difficult to grow a predetermined film. In the case of VPE, a process raw material reacts with the wall of an epitaxial growth reaction chamber, thereby making it difficult to grow a predetermined film.

Where an $Al_xGa_yIn_zN$ (where x+y+z=1, x≧0, y≧0, z≧0) film is formed by means of MOCVD, an operation is performed, as follows. First, a target substrate is loaded into a process chamber, and placed on a susceptor (worktable) having being heated to a predetermined temperature by a heater. Then, one or more of organic metal raw materials, such as trimethylaluminum (TMA), trimethylgallium (TMG), and trimethylindium (TMI), and ammonia are fed as process raw materials, along with a carrier gas, such as hydrogen or nitrogen, into a process chamber. Then, the process raw materials cause reaction and decomposition (reaction of the organic metal with ammonia) in the process chamber, and components thereby provided form an epitaxial film on a target substrate.

The epitaxial film is expressed by a general formula $Al_xGa_yIn_zN$ (where x+y+z=1, x≧0, y≧0, z≧0). For example, the epitaxial film is an aluminum nitride film, gallium nitride film, indium nitride film, aluminum-gallium nitride film, aluminum-indium nitride film, or gallium-indium nitride film (for example, see Jpn. Pat. Appln. KOKAI Publication No. 2002-246323 (paragraph number 0005)).

According to the present inventors, a problem has been found in opto-electronics devices manufactured by conventional MOCVD apparatuses, in that the wavelength or brightness of emitted light differs between wafer lots (between devices belonging to different lots). As described later, this is though to be attributed to a low reproducibility in the composition of an epitaxial film, which is due to the structure of a raw material supply section in conventional MOCVD apparatuses.

BRIEF SUMMARY OF THE INVENTION

According to a first aspect of the present invention, there is provided an MOCVD apparatus comprising:

a process chamber configured to accommodate a target substrate;

a raw material supply section configured to supply a process raw material into the process chamber; and an exhaust section configured to exhaust the process chamber, the raw material supply section comprising a bubbling unit that stores an organic metal raw material in a liquid state, a carrier gas line configured to supply, into the bubbling unit, a carrier gas that causes the organic metal raw material in a liquid state to bubble up, a supply line configured to supply, into the process chamber, a mixture of the organic metal raw material with the carrier gas obtained in the bubbling unit, and a flow rate control portion provided on the carrier gas line to control the carrier gas flow rate, wherein the flow rate control portion comprises a plurality of mass flow controllers, which are disposed in parallel with each other and have full-scales different from each other for flow rate control, such that the plurality of mass flow controllers are switched for use, in accordance with the carrier gas flow rate.

According to a second aspect of the present. invention, there is provided an MOCVD method comprising:

supplying a process raw material into a process chamber that accommodates a target substrate while exhausting the process chamber; and causing the process raw material to decompose in the process chamber, and forming an epitaxial film on the target substrate from components thereby provided, supply of the process raw material comprising supplying a carrier gas into a bubbling unit, which stores an organic metal raw material in a liquid state, at a flow rate controlled by a flow rate control portion, and causing the organic metal raw material to bubble up by the carrier gas, and supplying a mixture of the organic metal raw material with the carrier gas thereby obtained into the process chamber, wherein the flow rate control portion comprises a plurality of mass flow controllers, which are disposed in parallel with each other and have full-scales different from each other for flow rate control, such that the plurality of mass flow controllers are switched for use, in accordance with the carrier gas flow rate.

BRIEF DESCRIPTION OF THE SEVERAL VIEWS OF THE DRAWING

FIG. 3 is a view showing the specifications of three MFCs used in the MOCVD apparatus shown in FIG. 1;

FIG. 4 is a graph showing the flow rate control manner of a dual range MFC;

FIG. 5 is a graph showing fluctuation in the wavelength of LEDs obtained by an experiment;

DETAILED DESCRIPTION OF THE INVENTION

In the process of developing the present invention, the inventors studied the cause of a problem in opto-electronics devices manufactured by conventional MOCVD apparatuses, in that the wavelength or brightness of emitted light differs between wafer lots (between devices belonging to different lots). As a result, the inventors have arrived at the findings given below.

Figure 6:
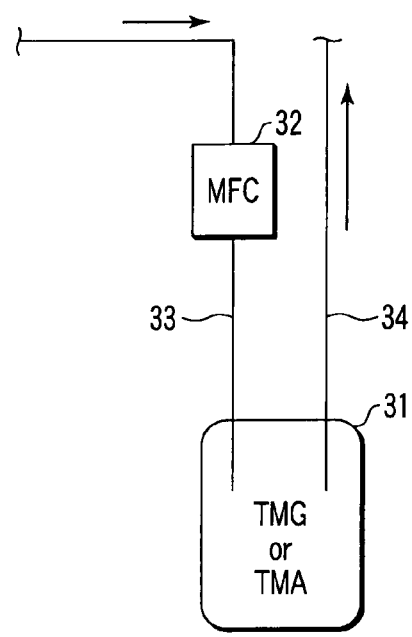
FIG. 6 is a view showing part of the raw material supply section of a conventional MOCVD apparatus.

FIG. 6 is a view showing part of the raw material supply section of a conventional MOCVD apparatus. As shown in FIG. 6, an organic metal raw material, such as TMG or TMA, is stored in a liquid state in a bubbling unit 31. A carrier gas line 33 is connected to the bubbling unit 31 to supply thereto a carrier gas, which causes the organic metal raw material in a liquid state to bubble up. The mixture of the organic metal raw material with the carrier gas obtained in the bubbling unit 31 is supplied into a process chamber (not shown) through a supply line 34. The carrier gas line 33 is provided with a MFC (mass flow controller) 32 to control the carrier gas flow rate.

Figure 7:
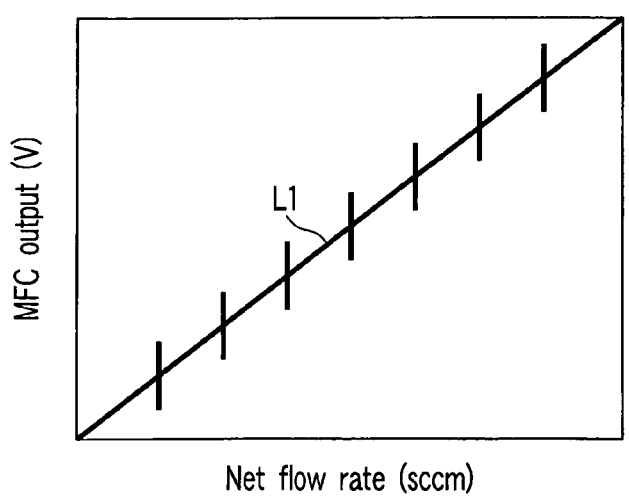
FIG. 7 is a graph showing the flow rate control manner of the raw material supply section shown in FIG. 6.

FIG. 7 is a graph showing the flow rate control manner of the raw material supply section shown in FIG. 6. As described above, the conventional MOCVD apparatus is arranged such that one carrier gas line 33 is connected to one bubbling unit 31 and is provided with a single MFC 32. The single MFC 32 performs overall flow rate control of a carrier gas through the carrier gas line 33, regardless of the flow rate degree. Accordingly, the flow rate control of a carrier gas is performed on the basis of the relationship between equally divided portions of both the MFC 32 output and the net flow rate, as indicated with a line L1 in FIG. 7. For example, the flow rate control of the MFC 32 is set to have a precision degree of about ±0.5%.

However, the precision degree of about ±0.5% brings about different flow rate errors, depending on the carrier gas flow rate degree (high or low). Particularly, for a raw material, such as TMG (trimethylgallium) or TMA (trimethylaluminum), the raw material amount supplied is sensitive to errors in the carrier gas flow rate. As a consequence, the reproducibility decreases in forming an epitaxial film having a composition as designed, thereby making it difficult to suppress fluctuation in the wavelength or brightness of emitted light between wafer lots (between devices belonging to different lots) within a predetermined range.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
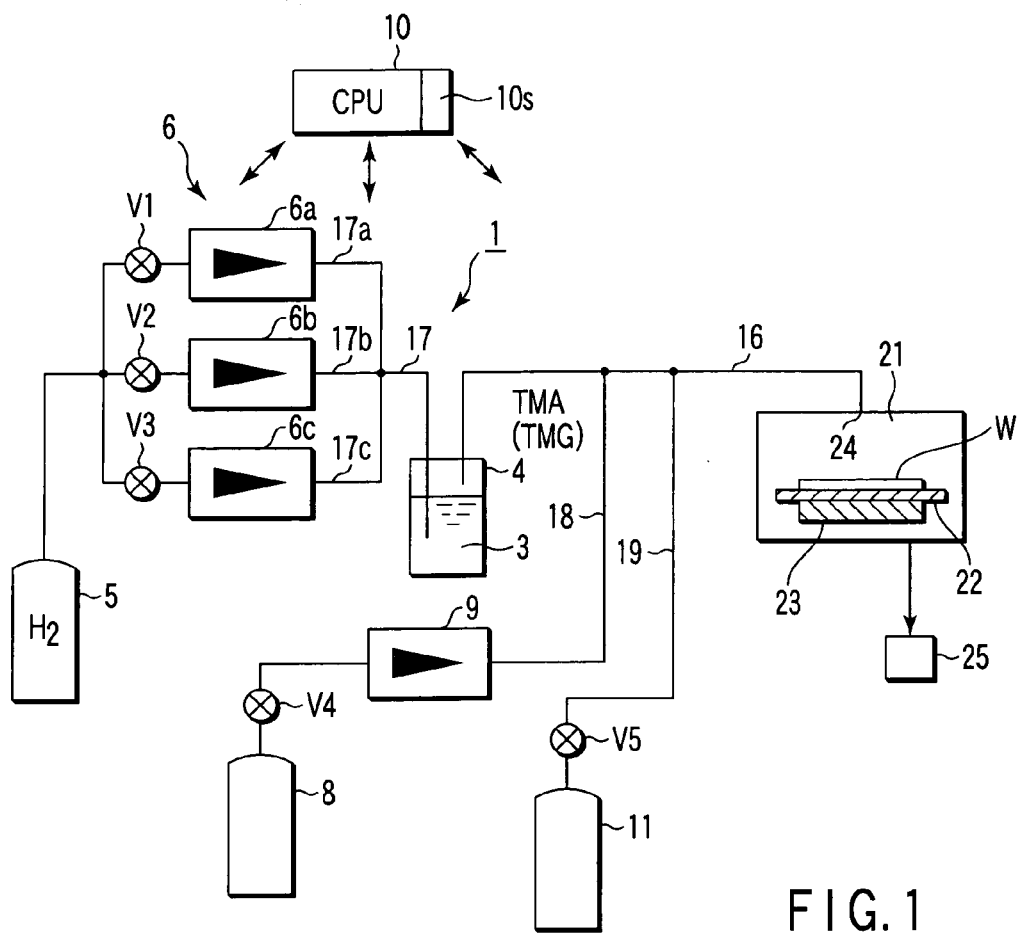
FIG. 1 is a schematic structural view showing an MOCVD apparatus according to an embodiment of the present invention.

FIG. 1 is a schematic structural view showing an MOCVD (Metal Organic Chemical Vapor Deposition) apparatus according to an embodiment of the present invention.

As shown in FIG. 1, the MOCVD apparatus includes a reaction container or process chamber 21 for vapor phase growth. The process chamber 21 is provided with a worktable (susceptor) 22 disposed therein, on which a target substrate (for example, a semiconductor wafer) W is placed. A heater 23, such as a radio frequency coil, is disposed below the susceptor 22 to heat the target substrate W. A raw material supply port 24 is formed in the ceiling of the process chamber 21 at a position opposite the worktable 22. An exhaust section 25 is connected to the bottom of the process chamber 12 to exhaust the interior of the process chamber 12 and set it to be in a vacuum state. The exhaust section 25 includes an exhaust pump, exhaust gas cleaning means (detoxification unit), and so forth.

The raw material supply port 24 of the process chamber 21 is connected to a raw material supply section 1 through a supply line 16. The raw material supply section 1 is arranged to supply raw materials for vapor phase growth of a group III–V compound semiconductor. Specifically, a bubbling unit 4 is connected to the supply line 16 and stores an organic metal raw material 3 of a group III element in a liquid state. The organic metal raw material 3 is selected from the group consisting of organic compounds of metals, e.g., Al, Ga, and In; such as TMA (trimethylaluminum), TMG (trimethylgallium), TMI (trimethylindium), TEA (triethylaluminum), TEG (triethylgallium), and TEI (triethylindium).

A carrier gas supply source 5 is connected to the bubbling unit 4 through a carrier gas line 17. The carrier gas supply source 5 supplies the bubbling unit 4 with a carrier gas, such as $H_2$, which causes the organic metal raw material in a liquid state to bubble up. The mixture of the organic metal raw material with the carrier gas obtained by bubbling of the organic metal raw material 3 with the carrier gas is supplied into the process chamber 21 through the supply line 16. The carrier gas line 17 is provided with a flow rate control portion 6 to control the carrier gas flow rate.

A gas supply source 8 of a special high-pressure raw material is also connected to the supply line 16 through a line 18, to supply a raw material gas, such as $PH_3$ or $AsH_3$, of a group V element, such as P or As. The line 18 is provided with a valve V4 and an MFC (mass flow controller) 9 near the gas supply source 8. A predetermined group V raw material gas is supplied into the process chamber 21 from the line 18 through the supply line 16 at a controlled flow rate.

In addition, a gas supply source 11 of a so-called purge gas, such as $H_2$ or $N_2$, is connected to the supply line 16 through a line 19. The line 19 is provided with a valve V5 near the gas supply source 11. The purge gas from the gas supply source 11 is supplied into the process chamber 21 to purge residual gases, after a reaction takes place in the process chamber 21, i.e., after a vapor phase growth operation ends, before a vapor phase growth operation starts, and so forth.

In FIG. 1, only one set of the bubbling unit 4 and the gas supply source 8 of a special high-pressure raw material is shown as an example, along with auxiliary components. However, in practice, according to the number of group III and group V elements necessary for the designed vapor phase growth, there are a plurality of such sets, each of which is formed of the bubbling unit 4 and the gas supply source 8 of a special high-pressure raw material along with auxiliary components. Furthermore, in the MOCVD apparatus, one raw material supply section 1 is connected to not necessarily only one process chamber 21. One raw material supply section 1 may be connected to a plurality of process chambers 21.

Figure 2:
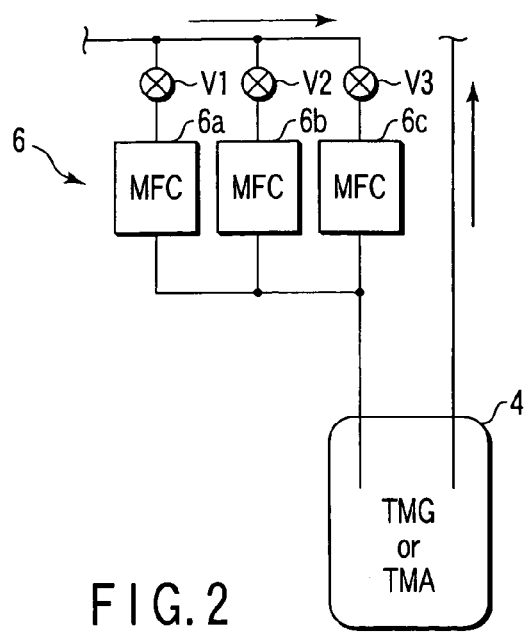
FIG. 2 is a view showing part of the raw material supply section of the MOCVD apparatus shown in FIG. 1.

FIG. 2 is a view showing part (centering around the flow rate control portion 6) of the raw material supply section of the MOCVD apparatus shown in FIG. 1. As shown in FIG. 2, the carrier gas line 17 is provided with three parallel lines 17a, 17b, and 17c, which are parallel with each other between the carrier gas supply source 5 and bubbling unit 4. The parallel lines 17a to 17c are provided with MFCs 6a, 6b, and 6c, respectively, for the carrier gas to pass therethrough. The parallel lines 17a to 17c are also provided with valves V1, V2, and V3, respectively, for the MFCs 6a to 6c to selectively communicate with the carrier gas line 17.

FIG. 3 is a view showing the specifications of the three MFCs 6a to 6c in a case where they are not of the dual range type described later. As shown in FIG. 3, the three MFCs 6a to 6c are arranged such that they have full-scales for flow rate control different from each other. For example, the first MFC 6a is set to have a full-scale of 200 ccm or sccm (cm³/min in the standard state). The second MFC 6b is set to have a full-scale of 60 ccm. The third MFC 6c is set to have a full-scale of 20 ccm. In this embodiment, the full-scale means a range of flow rate starting from zero to the upper limit of controllable flow rate.

The three MFCs 6a to 6c are switched for use, in accordance with the carrier gas flow rate. As the carrier gas flow rate is lower, one of the MFCs 6a to 6c having a smaller full-scale is used. In other words, the valves V1 to V3 are opened/closed to operate one of MFCs 6a to 6c selected in accordance with the carrier gas flow rate, thereby improving the control precision degree relative to a set flow rate.

More specifically, as shown in FIG. 3, the first MFC 6a is used when the carrier gas flow rate falls within a range of from 20 to 60 ccm. The second MFC 6b is used when the carrier gas flow rate falls within a range of from 6 to 20 ccm. The third MFC 6c is used when the carrier gas flow rate falls within a range of 6 ccm or less.

According to this arrangement, even where the three MFCs 6a to 6c have the same control precision degree, their effective control precision degrees take on different values. For example, it is assumed that the MFCs 6a to 6c are set to have the same control precision degree of ±0.5% in their respective full-scale ranges. In this case, the first MFC 6a having a full-scale of 200 ccm provides a flow rate precision degree of ±1.0 ccm. The third MFC 6c having a full-scale of 20 ccm provides a flow rate precision degree of ±0.1 ccm. Accordingly, where the carrier gas flow rate is set at 5 ccm, switching in response thereto from the first MFC 6a to the third MFC 6c changes the flow rate precision degree effectively ten times (the error range is one tenth).

FIG. 3 shows converted precision degrees, which are obtained by converting the control precision degrees (±0.5%) of the MFCs 6a to 6c, on the basis of their set flow rate ranges, into effective values relative to a 200 ccm full-scale. As shown in FIG. 3, the converted control precision degrees of the MFCs 6a to 6c are ±0.5%, ±0.15%, and ±0.05%, respectively. In other words, as the smaller the full-scale is, the more effective is the control precision degree. It should be noted that the control precision degrees of the three MFCs 6a to 6c may differ from each other in their respective full-scale ranges.

For example, switching of MFCs 6a to 6c can be performed in accordance with an MOCVD process recipe stored in advance in the memory section 10s of a CPU 10, e.g. in accordance with the film thickness of an epitaxial film to be formed. The relationship between the carrier gas flow rates for respective raw materials and the film thickness of an epitaxial film to be formed is also stored in advance in the memory section 10s as a control data. Accordingly, the CPU 10 can switch MFCs 6a to 6c, based on the stored process recipe and control data. For example, where the CPU 10 reads that the carrier gas flow rate is set at 18 ccm, it manipulates the valves V1 to V3 to use the MFC 6c having a full-scale of 20 ccm.

As described above, where a plurality of MFCs having different full-scales are suitably combined, it is possible to effectively cover the necessary range of the carrier gas flow rate. However, if a plurality of MFCs having full-scales close to each other are used, it brings about a waste and increases the cost. In light of this, two MFCs having full-scale upper limits adjacent to each other are arranged such that the ratio of the upper limit of one of the MFCs relative to the upper limit of the other of the MFCs is set to fall preferably within a range of from two to ten times, and more preferably within a range of from two to five times.

At least one of the MFCs 6a to 6c may be of the dual range type. The term "dual range type" means that one MFC has two flow rate control ranges, which have precision degrees different from each other. FIG. 4 is a graph showing the flow rate control manner of a dual range MFC. As indicated by a line L2 in FIG. 4, in a dual range MFC, the full-scale thereof is divided at smaller intervals in a low flow rate area N. This arrangement can prevent the precision degree from deteriorating in the low flow rate area N. For example, as shown in FIG. 4, where the full-scale is dived into eight portions, a low flow rate area is divided into four portions at smaller intervals, and the other area is divided into four portions at larger intervals. In this respect, conventional MFCs are arranged such that the full-scale is dived into eight portions at regular intervals.

Next, an explanation will be given of a modification of the embodiment, which employs dual range MFCs. In this modification, the specifications of the three MFCs 6a to 6c are the same as those shown in FIG. 3 except for converted precision degrees. The converted precision degrees of the modification are ±0.17% (6a), ±0.05% (6b), and ±0.017% (6c), which will be explained later in detail.

In this modification, all the three MFCs 6a to 6c are of the dual range type. The MFCs 6a to 6c have full-scales of 200 ccm, 60 ccm, and 20 ccm, respectively. Each of the MFCs 6a to 6c has a control precision degree of ±1.0% within a net flow rate of from 31 to 100%, and a control precision degree of ±0.17% within a net flow rate of from 0 to 30%, in the full-scale range.

The MFCs 6a to 6c are set to be used when the carrier gas flow rate falls within a range of from 20 to 60 ccm, a range of from 6 to 20 ccm, and a range of 6 ccm or less, respectively. Accordingly, each of the MFCs 6a to 6c is used at a net flow rate of 30% or less, and thus the control precision degree is ±0.17% in the service range. Where the MFCs 6a to 6c are of the dual range type, the control precision degree of each of them can be changed from ±0.5% to ±0.17% for a specific gas flow rate range within the full-scale thereof, thereby improving the control precision degree.

As described above, even where the MFCs 6a to 6c have the same control precision degree, their effective control precision degrees take on different values. For example, it is assumed that the control precision degrees (±0.17%) of the MFCs 6a to 6c are converted, on the basis of their set flow rate ranges, into effective values relative to a 200 ccm full-scale. In this case, the converted control precision degrees of the MFCs 6a to 6c are ±0.17%, ±0.05%, and ±0.017%, respectively.

As described above, this modification employs the three MFCs 6a to 6c of the dual range type with different full-scales, disposed in parallel with each other, as shown in FIG. 2. The MFCs 6a to 6c can use a control precision degree of ±0.17% (a precision degree before it is converted relative to a 200 ccm full-scale) for a specific gas flow rate range within the full-scale thereof, thereby improving the control precision degree. It should be noted that the full-scale is divided at smaller intervals not necessarily in a low flow rate area, but may be in another area.

PRESENT EXAMPLE

Semiconductor devices (LEDs) were manufactured in the MOCVD apparatus shown in FIG. 1, and examined in terms of fluctuation in the wavelength characteristic. For a first present example, the MFCs 6a to 6c used had different full-scales and were not of the dual range type. For a second present example, the MFCs 6a to 6c used had different full-scales and were of the dual range type.

In manufacturing the devices, a GaAs target substrate was placed on the worktable 22 in the process chamber 21 of the MOCVD apparatus. Then, a reaction gas, such as TMG, TMA, or TMI (trimethylindium), and phosphine ($PH_3$) were fed along with a carrier gas, such as hydrogen ($H_2$), into the process chamber 21. By doing so, an epitaxial film was grown at about 500 to 900° C. to form a non-doped $In_{0.49}(Ga_{0.60}Al_{0.40})_{0.51}P$ film having a thickness of about 0.5 µm.

In this process, the base flow rate of TMG or TMA was shifted from a set value to see influences thereof on the wavelength of emitted light from LEDs. In the first present example (the MFCs 6a to 6c used were not of the dual range type), LEDs were formed at a MFC precision degree of ±0.5%, thereby showing a wavelength fluctuation of ±2.0 nm. On the other hand, in the second present example (the MFCs 6a to 6c used were of the dual range type), LEDs were formed at a MFC precision degree of ±0.2%, thereby showing a wavelength fluctuation of ±0.5 nm. FIG. 5 is a graph showing fluctuation in the wavelength of LEDs of the second present example obtained by the experiment.

As described above, the MOCVD apparatus according to this embodiment employs a plurality of MFCs with different full-scales, and controls the carrier gas flow rate by switching the MFCs in accordance with the film thickness of an epitaxial film to be formed. As a consequence, the reproducibility increases in forming an epitaxial film having a composition as designed. Furthermore, as described above, where the MFCs with different full-scales are of the dual range type, a better result can be obtained.

Since an epitaxial film is formed at an improved precision degree, semiconductor devices or LEDs thereby manufactured have suppressed fluctuation in the wavelength or brightness of emitted light between wafer lots (between devices belonging to different lots). As a consequence, the yield and reliability of high brightness LEDs are remarkably improved.

In the embodiment, the MOCVD apparatus is used to manufacture LEDs. The present invention, however, may be similarly applied to other semiconductor devices, so long as an epitaxial film is formed in an MOCVD apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An MOCVD method comprising:
   supplying a process raw material into a process chamber that accommodates a target substrate while exhausting the process chamber; and
   causing the process raw material to decompose in the process chamber, and forming an epitaxial film on the target substrate from components thereby provided,
   supply of the process raw material comprising;
   supplying a carrier gas into a bubbling unit, which stores an organic metal raw material in a liquid state, at a flow rate controlled by a flow rate control portion, and
   causing the organic metal raw material to bubble up by the carrier gas, and supplying a mixture of the organic metal raw material with the carrier gas thereby obtained into the process chamber,
   wherein the flow rate control portion comprises a plurality of mass flow controllers, which are disposed in parallel with each other and have full-scales different from each other for flow rate control, such that the plurality of mass flow controllers are switched for use, in accordance with the carrier gas flow rate.

2. The method according to claim 1, further comprising:
   storing a process recipe in a memory section; and
   switching the plurality of mass flow controllers based on the process recipe by an operation control section.

3. The method according to claim 1, wherein the organic metal raw material is selected from the group consisting of trimethylaluminum, trimethylgallium, trimethylindium, triethylaluminum, triethylgallium, and triethylindium.

4. The method according to claim 1, wherein the plurality of mass flow controllers comprises a mass flow controller having two flow rate control ranges, which have precision degrees different from each other.

5. The method according to claim 1, wherein the plurality of mass flow controllers comprises three mass flow controllers, which are disposed in parallel with each other and have full-scales different from each other for flow rate control.

6. The method according to claim 1, wherein each of the full-scales is defined by a range of flow rate starting from zero.

7. The method according to claim 6, wherein the plurality of mass flow controllers comprises first and second mass flow controllers respectively having first and second upper limits as upper limits of the full-scales, such that a ratio of the second upper limit relative to the first upper limit is set to fall within a range of from two to ten times.

8. The method according to claim 1, wherein, as the carrier gas flow rate is lower, one of the plurality of mass flow controllers having a smaller full-scale is used.

9. The method according to claim 8, wherein each of the full-scales is defined by a range of flow rate starting from zero.

10. The method according to claim 9, wherein the plurality of mass flow controllers comprises first and second mass flow controllers respectively having first and second upper limits as upper limits of the full-scales, such that a ratio of the second upper limit relative to the first upper limit is set to fall within a range of from two to ten times.

* * * * *